United States Patent
Cheng et al.

(10) Patent No.: US 9,123,569 B1
(45) Date of Patent: Sep. 1, 2015

(54) COMPLEMENTARY METAL-OXIDE-SEMICONDUCTOR STRUCTURE WITH III-V AND SILICON GERMANIUM TRANSISTORS ON INSULATOR

(71) Applicant: International Business Machines Corporation, Armonk, NY (US)

(72) Inventors: Cheng-wei Cheng, White Plains, NY (US); Amlan Majumdar, White Plains, NY (US); Kuen-Ting Shiu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/199,268

(22) Filed: Mar. 6, 2014

(51) Int. Cl.
*H01L 27/092* (2006.01)
*H01L 21/84* (2006.01)
*H01L 29/08* (2006.01)
*H01L 27/12* (2006.01)
*H01L 29/20* (2006.01)

(52) U.S. Cl.
CPC ............ *H01L 27/0922* (2013.01); *H01L 21/84* (2013.01); *H01L 27/1203* (2013.01); *H01L 29/0847* (2013.01); *H01L 29/20* (2013.01)

(58) Field of Classification Search
CPC . H01L 27/0922; H01L 21/84; H01L 29/0847; H01L 27/1203; H01L 29/20; H01L 29/2003; H01L 29/66462; H01L 29/66431; H01L 27/092; H01L 2924/13091; H01L 21/02381; H01L 21/28264; H01L 29/7783; H01L 21/02

USPC .................... 257/E21.618–E21.636
See application file for complete search history.

(56) References Cited

U.S. PATENT DOCUMENTS

| | | | |
|---|---|---|---|
| 8,314,017 B2 | 11/2012 | Merckling | |
| 8,481,410 B1 | 7/2013 | LiCausi et al. | |
| 8,486,770 B1 | 7/2013 | Wu et al. | |
| 8,618,556 B2 * | 12/2013 | Wu et al. | 257/77 |
| 2012/0228672 A1 | 9/2012 | Daval et al. | |
| 2013/0001591 A1 | 1/2013 | Wu et al. | |

FOREIGN PATENT DOCUMENTS

| | | |
|---|---|---|
| CN | 102664166 A | 9/2012 |
| JP | 09055356 A | 2/1997 |

* cited by examiner

*Primary Examiner* — Julio J. Maldonado
*Assistant Examiner* — Farun Lu
(74) *Attorney, Agent, or Firm* — Trentice V. Bolar; Louis J. Percello

(57) ABSTRACT

Embodiments for the present invention provide a CMOS structure and methods for fabrication. In an embodiment of the present invention, a CMOS structure comprises a NFET, formed on a wafer, having a gate stack and a channel. A PFET having a gate stack and a channel is also formed on the wafer. The channel of the PFET and the channel of the NFET include semiconductor material formed on III-V semiconductor material, such that the III-V semiconductor material acts like a buried oxide because of a valence band offset between the semiconductor material and the III-V material. There is a height difference between a terminal of the NFET and a terminal of the PFET. In addition, the gate stack NFET is the same height as the gate stack PFET.

20 Claims, 6 Drawing Sheets

COMPLEMENTARY METAL-OXIDE-SEMICONDUCTOR STRUCTURE WITH III-V AND SILICON GERMANIUM TRANSISTORS ON INSULATOR

BACKGROUND

The present disclosure relates generally to the field of semiconductor fabrication, and more particularly to the fabrication of high-performance complementary metal-oxide-semiconductor structure with III-V n-channel field effect transistors and silicon-germanium p-channel field effect transistors on insulator.

As silicon (hereinafter "Si") complementary metal-oxide-semiconductor (hereinafter "CMOS") technology continues to scale down its minimum critical dimension, which is the transistor gate length, it becomes increasingly difficult to enhance device switching speed due to fundamental limitations. New device engineering is indispensable in overcoming difficulties of advanced CMOS and realizing high performance large scale integrations under, for example, the 10 nm gate length regime. In addition to the improvements of gate stacks using metal gate/high k gate dielectrics and the channel electrostatic control using fully-depleted silicon-on-insulator substrates and multi-gate metal-oxide-semiconductor field-effect transistors, new channel material with enhanced carrier transport properties are needed for enhancing the performance of CMOS-based circuits and chips.

III-V n-channel field effect transistors are considered a compelling candidate for extending the device scaling limits of low-power and high-speed CMOS circuits and chips, owing to their enhanced electron transport properties compared to those of Si. Silicon-germanium p-channel field effect transistors are also considered a compelling candidate, owing to their superior hole transport properties compared to those in Si.

SUMMARY

Embodiments for the present invention provide a CMOS structure and method for fabrication. In an embodiment of the present invention, a CMOS structure comprises a NFET, formed on a wafer, having a gate stack and a channel. A PFET having a gate stack and a channel is also formed on the wafer. The channel of the PFET and the channel of the NFET include semiconductor material formed on III-V semiconductor material, such that the III-V semiconductor material acts like a buried oxide because of a valence band offset between the semiconductor material and the III-V semiconductor material. There is a height difference between a terminal of the NFET and a terminal of the PFET. In addition, the gate stack of the NFET is the same height as the gate stack of the PFET.

DETAILED DESCRIPTION

Figure 1A:
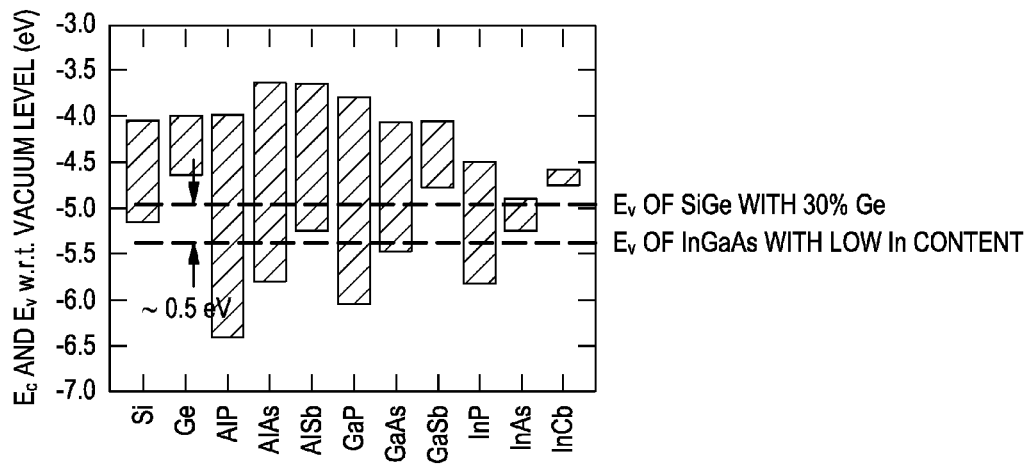
FIG. 1A depicts a graph illustrating conduction and valence bands with respect to vacuum level for various semiconducting materials that may be employed in embodiments of the present invention.

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The figures represent cross-section portions of a semiconductor chip or a substrate during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

New device engineering is indispensable in overcoming difficulties of advanced complementary metal-oxide-semiconductor (hereinafter "CMOS") and realizing high performance large scale integrations under, for example, the 10 nm gate-length regime. In addition to the improvements of gate stacks using metal gate/high k gate dielectrics, and the channel electrostatics control using fully-depleted silicon-on-insulator (hereinafter "SOI") and multi-gate metal-oxidesemiconductor field effect transistors (hereinafter "MOSFET"), new channel materials with enhanced carrier transport properties are needed for enhancing the performance of CMOS circuits and chips. III-V channel NFETs are considered a compelling candidate for extending the device scaling limits of low-power and high-speed CMOS operation, owing to their enhanced carrier transport properties compared to those Si. Silicon-germanium (hereinafter "SiGe") p-channel PFETs are also considered a compelling candidate in light of their improved hole transport properties compared to those in Si.

FIG. 1A depicts a graph illustrating conduction and valence bands with respect to vacuum level for various semiconducting materials that may be employed in embodiments of the present invention. Here, the valence band edge of SiGe with 30% Ge, as well as that of InGaAs with low In content, is such that their valence band offset is estimated to be about 0.5 eV. Such an offset not only promotes the confinement of holes in PFETs to the SiGe or Ge layer, but also results in any ITT-V layer located underneath the SiGe or Ge layer acting like a buried oxide (hereinafter "BOX") layer.

Structure

Figure 1B:
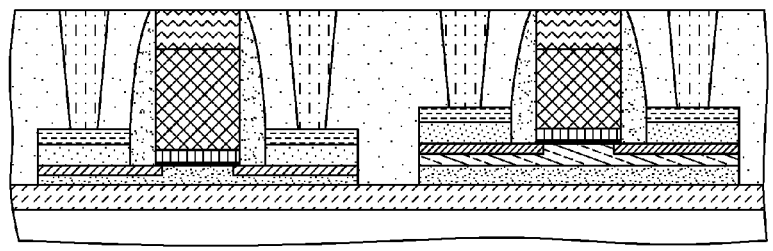
FIG. 1B depicts a CMOS structure, in accordance with an embodiment of the present invention.

FIG. 1B depicts a CMOS structure, in accordance with an embodiment of the present invention. The CMOS structure illustrated includes a ITT-V NFET and SiGe PFET on insulator. The NFET channel has a thickness that is, for example, less than 10 nm and may include gallium arsenide (hereinafter "GaAs") or indium gallium arsenide (hereinafter "InGaAs") with low In content. The PFET channel is also thin, for example, less than 10 nm, and may include SiGe or Ge, wherein the III-V layer located underneath the SiGe layer can act like a BOX layer because of large valence band offsets (discussed above). The height difference between the NFET and PFET terminals is the thickness of the III-V layer included in the PFET. The height of the gate stacks for the NFET and PFET are the same and can be achieved using gate-stack chemical mechanical polish (hereinafter "CMP"). Both the NFET and PFET have raised source drain (hereinafter "RSD") structures that include Ge. In both the NFET and the PFET, the RSD structure is at the same distance from the gate edge.

Method

The fabrication steps described below may include resist and/or hard mask deposition and/or removal steps although not depicted, in accordance with conventional processes.

Figure 1C:
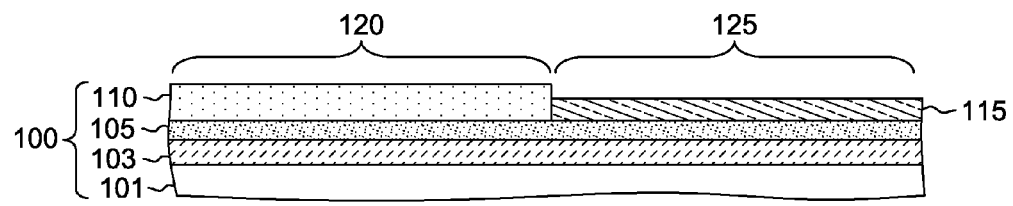
FIG. 1C depicts fabrication steps, in accordance with an embodiment of the present invention.

FIG. 1C depicts fabrication steps, in accordance with an embodiment of the present invention. Wafer 100, which may be a III-V-on-insulator wafer, includes layers 101, 103, 105, 110, and 115. Layer 101 includes substrate material, such as silicon (hereinafter "Si"). Layer 103 is a buried oxide layer that includes, for example, $SiO_2$. Layer 105 includes III-V semiconductor material, such as GaAs or InGaAs with low In content. III-V semiconductor material refers to the materials included in the groups III and V of the periodic table. III-V channel NFETs are compelling candidates for extending device scaling limits of low-power and high-speed CMOS operation, owing to their superior carrier transport properties compared to Si. In an embodiment, the thickness of layer 105 is 10 nm or less.

Layer 110 is deposited on layer 105 by an appropriate process, such as chemical vapor deposition (hereinafter "CVD"). Layer 110 can be a dielectric, such as, but not limited to, silicon nitride (hereinafter "SiN"). Regions 120 and 125 denote NFET and PFET regions, respectively. Excess material may be removed from layer 110 by an appropriate process, such as lithography and etching. Layer 115 may be deposited on layer 105 by an appropriate process, such as low-temperature epitaxy of SiGe or Ge that is selective to layer 110. In an embodiment, the thickness of layer 115 is 10 nm or less. Layer 105, positioned under layer 115, can act like a bottom barrier because of appropriate valence band offset (discussed above). In another embodiment, the height difference between the terminals of the NFET and PFET is the thickness of layer 115.

Figure 2:
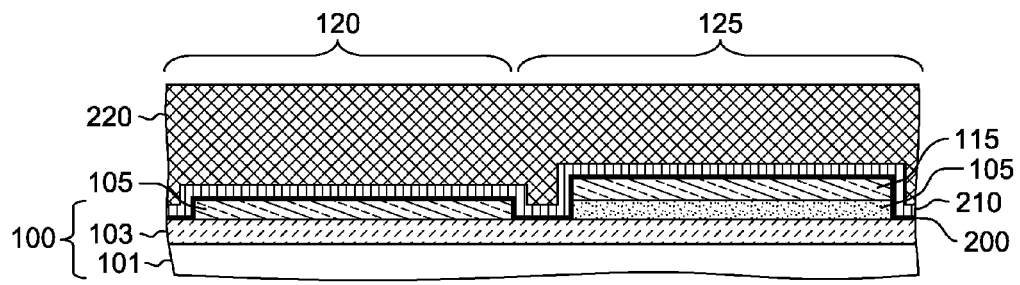
FIG. 2 depicts additional fabrication steps, in accordance with an embodiment of the present invention.

FIG. 2 depicts additional fabrication steps, in accordance with an embodiment of the present invention. Layer 110 is removed from NFET regions (i.e. region 120) by, for example, wet etching selective to SiGe. In an embodiment, component isolation can be achieved by shallow trench isolation. In another embodiment, component isolation is achieved by mesa isolation, wherein, for example, excess material is removed from layers 105 and 115 by lithography and etch stopping on BOX layer 103. Layer 200, which includes dielectric material, is deposited on the CMOS structure using an appropriate process. Layer 200 forms the FET gate dielectric. Layer 210, which includes conductive material, is deposited on layer 200 using an appropriate process. Layer 210 forms the FET gate metal. Layer 220 is formed on layer 210 using an appropriate process. Excess material is removed from layer 220 using an appropriate process, such as CMP. Layer 220 is a conductive material that forms part of the gate conductor. In an embodiment, layer 220 is amorphous Si that this doped either by ion implantation or by in-situ doping during the deposition process.

Figure 3:
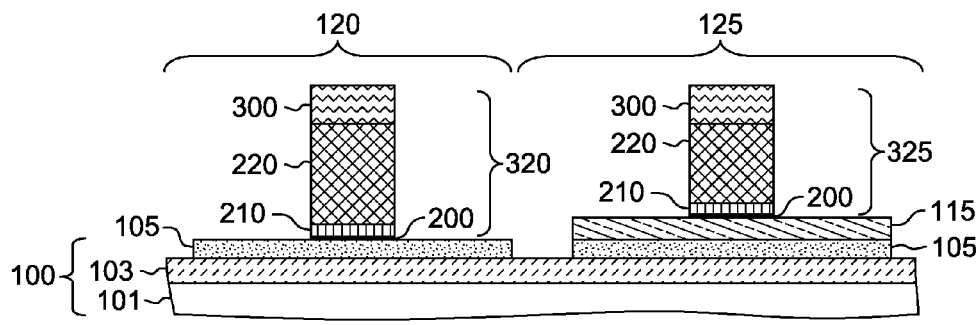
FIG. 3 depicts additional fabrication steps, in accordance with an embodiment of the present invention.

FIG. 3 depicts additional fabrication steps, in accordance with an embodiment of the present invention. Layer 300 is deposited on layer 220 using an appropriate process. Layer 300 is a material, such as, but not limited to, SiN, which can be used as a hard mask layer for selective epitaxy of RSD structures, which is performed later in the process flow (discussed below). To define gate structures 320 and 325 of regions 120 and 125, respectively, excess material is removed from layers 300, 220, 210, and 200 by, for example, lithography and etching. The etch process can be wet etch or reactive-ion etch (hereinafter "RIE") or a combination of the two.

Figure 4:
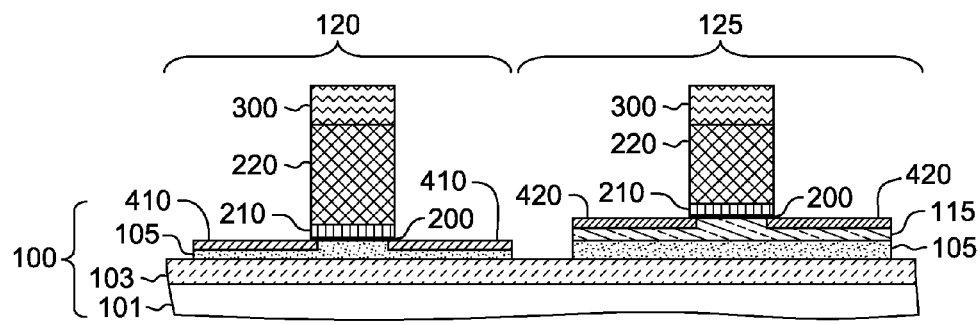
FIG. 4 depicts additional fabrication steps, in accordance with an embodiment of the present invention.

FIG. 4 depicts additional fabrication steps, in accordance with an embodiment of the present innovation. Extensions 410 and 420 are implanted using appropriate processes, such as, lithography and ion implantation. Extensions 410 to III-V NFETs are implanted with n-type dopants to III-Vs, such as but not limited to, Si and tellurium (hereinafter "Te"). Extensions 420 to SiGe PFETs are implanted with p-type dopants, such as, but not limited to, boron (hereinafter "B") and In. Extensions 410 and 420 may be laser annealed for diffusionless activation. If the fabrication uses a low-temperature flow, implantation can occur without an offset spacer. Else, an offset spacer can be formed prior to implantation.

Figure 5:
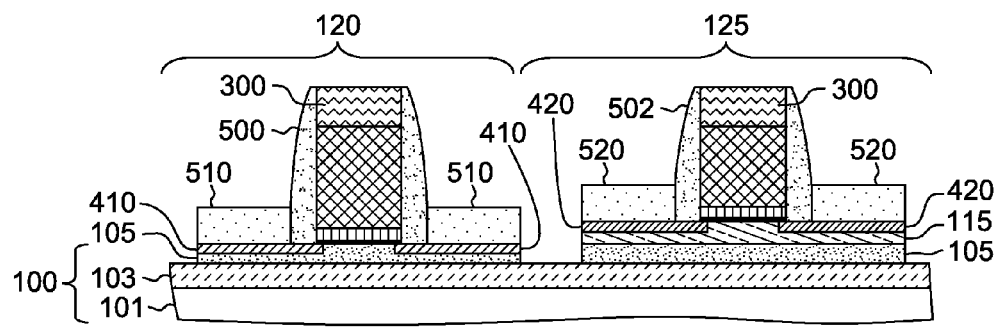
FIG. 5 depicts additional fabrication steps, in accordance with an embodiment of the present invention.

FIG. 5 depicts additional fabrication steps, in accordance with an embodiment of the present innovation. Spacers 500 and 502 are formed on the gate stacks of regions 120 and 125, respectively, by, for example, depositing and etching dielectric material using an appropriate process, such CVD and spacer RIE. Terminals 510 and 520 are source and drain structures that include a conductive material, such as Ge, that can be made either n-type or p-type by ion implantation. In an embodiment, terminals 510 and 520 are formed on channels 410 and 420, respectively, by depositing Ge on the wafer by RSD epitaxy, which is performed selective to layer 103, layer 300, and spacer structures 500 and 502. In an embodiment, terminal 510 is an n-doped terminal that is formed by lithography and ion implantation of species, such as, arsenic (hereinafter "As"), phosphorus (hereinafter "P"), or antimony (hereinafter "Sb").

In an embodiment, terminal 520 is a p-doped terminal that is formed by lithography and ion implantation of species, such as, B or In. Excess resist may be removed prior to the laser annealing of regions 120 and 125 to promote diffusion-less activation of the dopants included therein.

Figure 6:
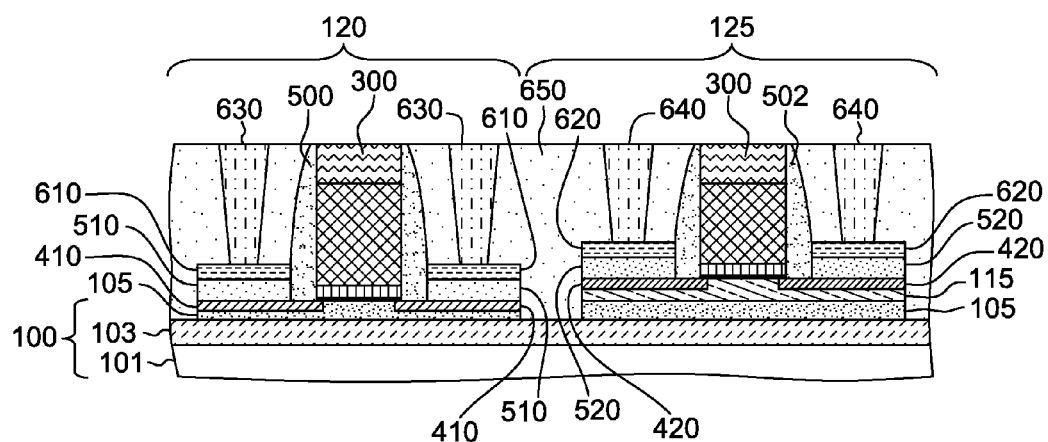
FIG. 6 depicts additional fabrication steps, in accordance with an embodiment of the present invention.

FIG. 6 depicts additional fabrication step, in accordance with an embodiment of the present innovation. Specifically, FIG. 6 illustrates the formation of self-aligned metal-germanide contacts 610 and 620 on terminals 510 and 520, respectively, where the metal is, but not limited to, nickel (hereinafter "Ni") or titanium (hereinafter "Ti") or cobalt (hereinafter "Co"). The formation of self-aligned metal-germanide contacts is similar to that of nickel-silicide (hereinafter "NiSi") for Si CMOS. The process steps include deposition of a metal, rapid thermal annealing (hereinafter "RTA") to form metal germanide, and selective etching of unreacted metal atop layer 103, layer 300, and spacers 500 and 502.

In certain embodiments, dielectric 650 is an inter-layer dielectric. Dielectric 650 can be formed on the wafer using an appropriate process. Excess dielectric 650 can be removed from the wafer stopping at layer 300 and spacers 500 and 502. Contact vias 630 and 640 are formed on contacts 610 and 620, respectively, using convention back end of line (hereinafter "BEOL") processing.

Structure

Figure 7A:
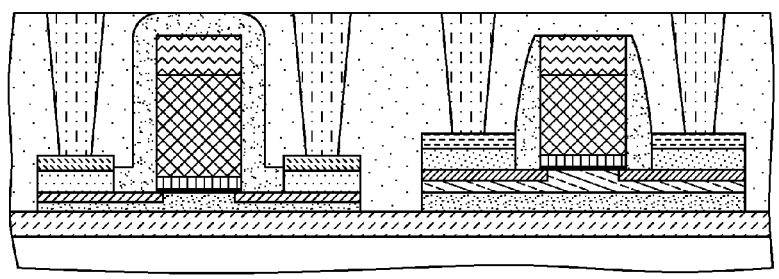
FIG. 7A depicts a CMOS structure, in accordance with an embodiment of the present invention.

FIG. 7A depicts a CMOS structure, in accordance with an embodiment of the present innovation. The CMOS structure illustrated includes a III-V NFET and SiGe PFET on insulator. The NFET channel has a thickness that is, for example, less than 10 nm and includes GaAs or InGaAs with low In content. The PFET channel also has a thickness that is, for example, less than 10 nm, and includes SiGe or Ge, wherein the III-V layer positioned underneath the SiGe layer can act like a BOX because of large valence band offsets (discussed above). The height difference between the terminals of the NFET and PFET is the thickness of the III-V layer of the PFET. The height of the gate stacks for the NFET and PFET are the same and can be achieved using gate-stack CMP. Both the NFET and PFET have RSD structures that include n-type III-V and p-type Ge, respectively, resulting in NFET and PFET RSDs that are not at the same distance from the gate edge, for example, the RSD structure is closer to the gate edge for the PFET.

Method

Figure 7B:
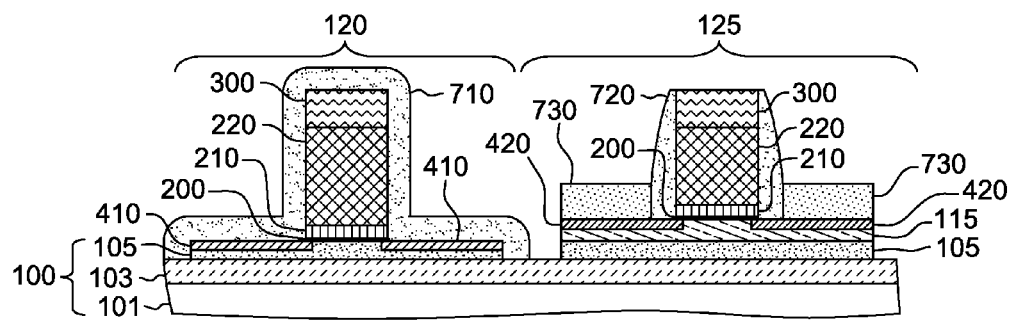
FIG. 7B depicts additional fabrication steps, in accordance with an embodiment of the present invention.

FIG. 7B depicts additional fabrication steps, in accordance with an embodiment of the present innovation. Dielectric cover 710 and spacer 720 are formed on the structure of FIG. 4 by depositing dielectric material, such as but not limited to SiN, using an appropriate deposition process. Cover 710 and spacer 720 are formed simultaneously by lithographically opening up region 125, performing dielectric RIE, and then removing excess resist. Terminal 730 may be formed on extension 420 by selective RSD epitaxy, such as in-situ B-doped Ge or SiGe RSD epitaxy, that is selective to layers 103 and 300, cover 710, and spacer 720.

Figure 8:
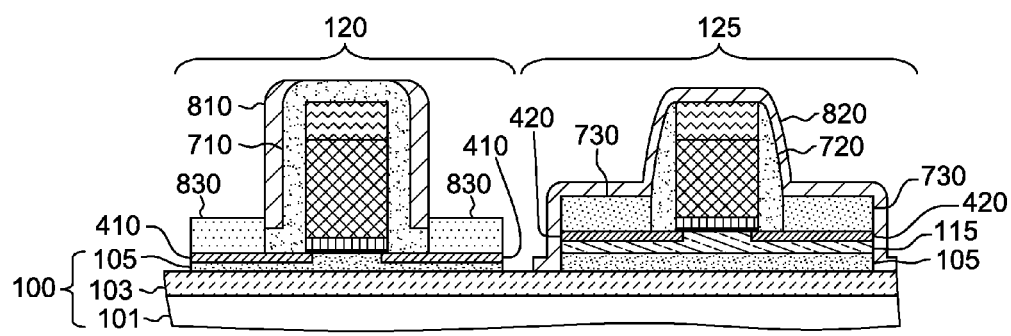
FIG. 8 depicts additional fabrication steps, in accordance with an embodiment of the present invention.

FIG. 8 depicts additional fabrication steps, in accordance with an embodiment of the present innovation. Spacer 810 and cover 820 are formed on dielectric cover 710 and dielectric spacer 720, respectively, by, for example, depositing a dielectric material that is substantially different from the dielectric material used for forming dielectric cover 710 and dielectric spacer 720 (discussed below). The dielectric spacer 810 and dielectric cover 820 are formed simultaneously by lithographically opening up the NFET region 120, performing dielectric RIE, and then removing excess resist.

Terminal 830 is a n-doped terminal that includes III-V dielectric material. Terminal 830 is formed on extension 410 by selective RSD epitaxy, for example, selective in-situ Si-doped III-V RSD epitaxy, that is selective to layer 103, and layers 710, 810, and 820.

Figure 9:
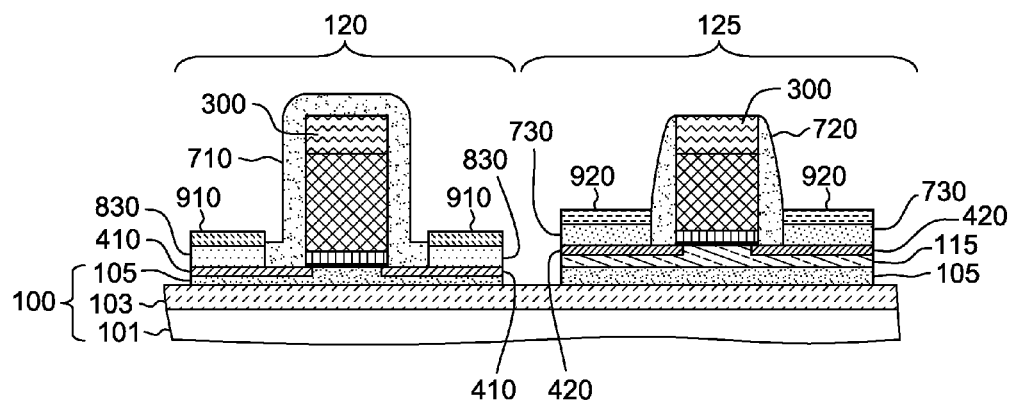
FIG. 9 depicts additional fabrication steps, in accordance with an embodiment of the present invention.

FIG. 9 depicts additional fabrication steps, in accordance with an embodiment of the present innovation. Spacer 810 and cover 820 are removed selective to cover 710 and spacer 720, respectively. Since the dielectric material used for forming layers 810 and 820 is substantially different from the dielectric material used for forming the dielectrics 710 and 720 (discussed above), one can remove spacer 810 and cover 820 by, for example, wet etch that is selective to the cover 710 and spacer 720. Contacts 910 and 920 are formed on doped RSD terminals 730 and 830, respectively, by a NiSi-like process. In an embodiment, contacts 910 and 920 are self aligned. Specifically, contact 910 is a metal-III-V contact, while contact 920 is a metal-germanide contact, wherein applicable metals include, but are not limited to, Ni or Ti or Co. The self-aligned metal-III-V and metal-germanide contacts may be formed in a similar fashion as that of NiSi for Si CMOS. For example, the process includes deposition of a metal, RTA to form the metal-III-V and metal germanide layers, and a selective etch of unreacted metal from layers 103 and 300, cover 710, and spacer 720.

Figure 10:
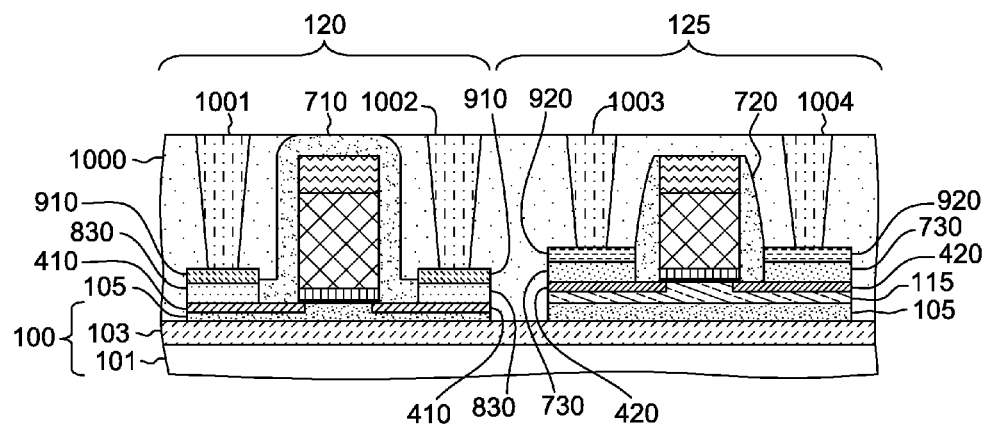
FIG. 10 depicts additional fabrication steps, in accordance with an embodiment of the present invention.

FIG. 10 depicts additional fabrication step, in accordance with an embodiment of the present innovation. Dielectric 1000 is deposited on the wafer using an appropriate process. Excess dielectric 1000 is removed by, for example, CMP stopping on dielectric cover 710. Contact vias 1001, 1002, 1003, and 1004 are formed are formed in a similar fashion as contacts 910 and 920 (discussed above).

Structure

Figure 11A:
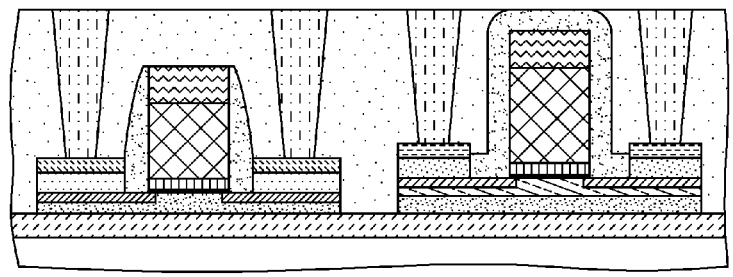
FIG. 11A depicts a CMOS structure, in accordance with an embodiment of the present invention.

FIG. 11A depicts a CMOS structure, in accordance with an embodiment of the present innovation. The CMOS structure illustrated includes a III-V NFET and SiGe PFET on insulator. The NFET channel has a thickness that is, for example, less than 10 nm and includes GaAs or InGaAs with low In content. The PFET channel has thickness that is, for example, less than 10 nm, and includes SiGe or Ge, wherein the III-V layer positioned under the SiGe layer can act like a BOX because of large valence band offsets (discussed above). The height difference between the NFET and PFET terminals is the thickness of the III-V layer included in the PFET. The height of the gate stacks for both the NFET and PFET are the same and can be achieved using gate-stack CMP. Both the NFET and PFET have RSD structures that include n-type III-V and p-type Ge, respectively, resulting in NFET and PFET RSDs that are not at the same distance from the gate edge, for example, the RSD structure is positioned closer to the gate edge for the NFET.

Method

Figure 11B:
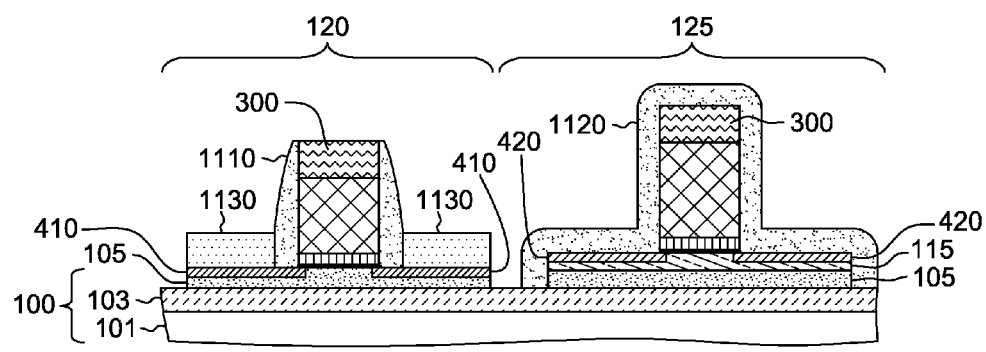
FIG. 11B depicts additional fabrication steps, in accordance with an embodiment of the present invention.

FIG. 11B depicts additional fabrication steps, in accordance with an embodiment of the present innovation. Spacer 1110 and cover 1120 are formed on the structure of FIG. 4 by depositing a dielectric material, such as but not limited to SiN, using an appropriate deposition process. The spacer 1110 and cover 1120 can be formed simultaneously by lithographically opening up the NFET region 120, performing dielectric RIE, and then removing excess resist. Terminal 1130 may then be formed on extension 410 by selective RSD epitaxy, such as in-situ Si-doped III-V RSD epitaxy, which is selective to layers 103 and 300, spacer 1110, and spacer 1120.

Figure 12:
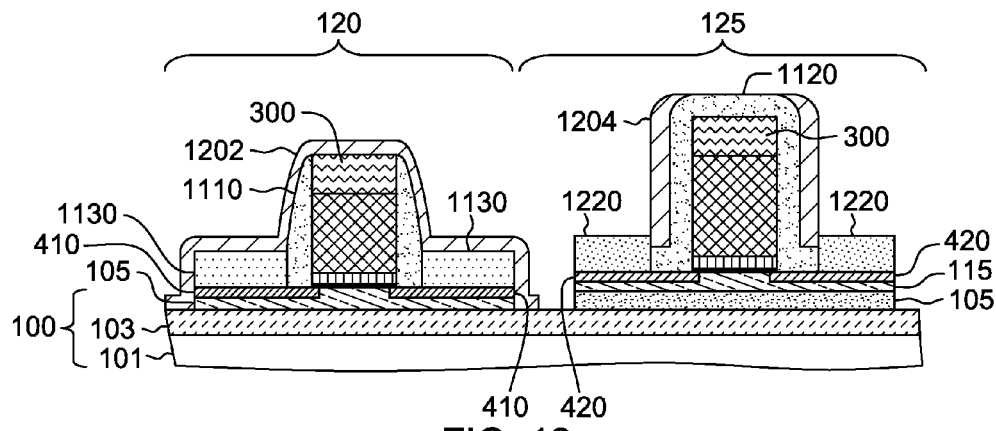
FIG. 12 depicts additional fabrication steps, in accordance with an embodiment of the present invention.

FIG. 12 depicts additional fabrication steps, in accordance with an embodiment of the present innovation. Cover 1202 and spacer 1204 are formed on layers 1110 and 1120, respectively, by depositing dielectric material that this substantially different from the dielectric material used for forming layers 1110 and 1120 (discussed below). Cover 1202 and spacer 1204 are formed simultaneously by lithographically opening up region 125, performing dielectric RIE, and then removing excess resist. In an embodiment, terminal 1220 is a p-doped terminal. Terminal 1220 may be formed on extension 420 by selective RSD epitaxy, for example, in-situ B-doped Ge or SiGe RSD epitaxy, that is selective to layers 103, 1202, and 1204.

Figure 13:
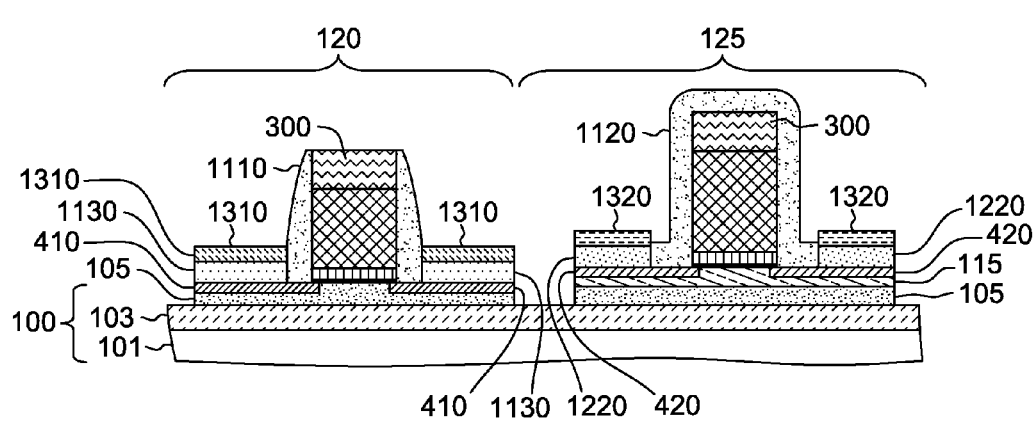
FIG. 13 depicts additional fabrication steps, in accordance with an embodiment of the present invention.

FIG. 13 depicts additional fabrication steps, in accordance with an embodiment of the present innovation. Layers 1202 and 1204 are removed selective to the layers 1110 and 1120, respectively. Since the dielectric material used for forming the dielectric layers 1202 and 1204 is substantially different from the dielectric material used for forming the dielectrics 1110 and 1120 (discussed above), one can remove dielectric layers 1202 and 1204 by, for example, wet etch that is selective to layers 1110 and 1120. In an embodiment, contacts 1310 and 1320 are self aligned. Contacts 1310 and 1320 are formed on doped RSD terminals 1130 and 1220, respectively, by, for example, a NiSi-like process. For example, contact 1310 is a metal-III-V contact while contact 1320 is a metal-germanide contact, where the metal includes, but is not limited to, Ni or Ti or Co. The formation of self-aligned metal-III-V and metal-germanide contacts is similar to that of NiSi for Si CMOS (discussed above). For example, the process steps include deposition of a metal, RTA to form the metal-III-V and metal germanide layers, and selectively etching unreacted metal from layers 103, 300, 1110, and 1120.

Figure 14:
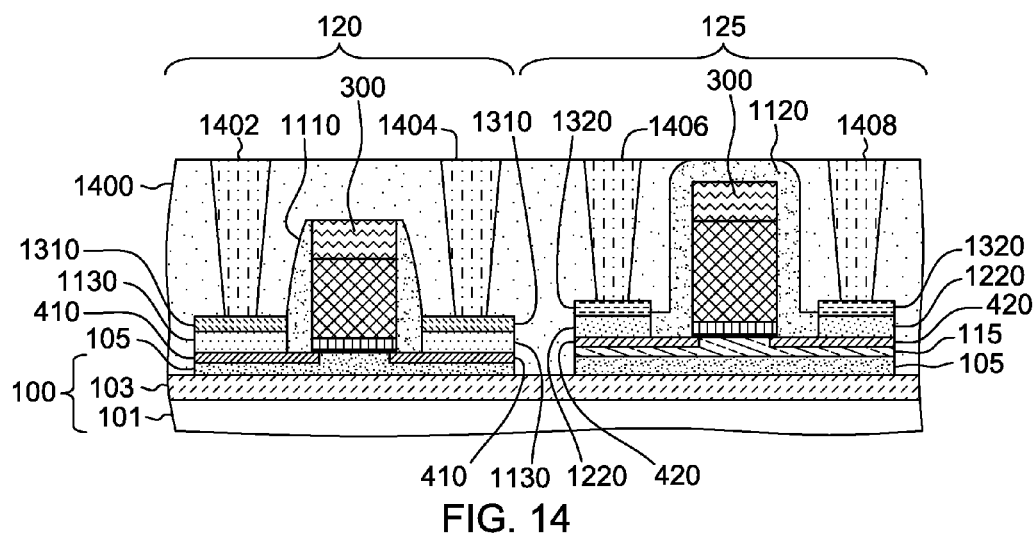
FIG. 14 depicts additional fabrication steps, in accordance with an embodiment of the present invention.

FIG. 14 depicts additional fabrication step, in accordance with an embodiment of the present innovation. Dielectric 1400 is deposited on the wafer using an appropriate process (discussed above). Excess dielectric 1400 is removed by, for example, CMP stopping on the spacer 1120. Contact vias 1402, 1404, 1406, and 1408 are formed in a manner similar to that used to form vias 1001, 1002, 1003, and 1004.

What is claimed is:

1. A CMOS structure comprising:
    a NFET, formed on a wafer, having a gate stack and a channel;
    a PFET, formed on the wafer, having a gate stack and a channel;
    wherein the channel of the PFET and the channel of the NFET include semiconductor material formed on III-V semiconductor material, such that the III-V semiconductor material acts like a buried oxide because of a valence band offset between the semiconductor material and the III-V material;
    wherein there is a height difference between a terminal of the NFET and a terminal of the PFET; and
    the gate stack NFET is the same height as the gate stack PFET.

2. The CMOS structure of claim 1, wherein the NFET channel and/or the PFET channel has a thickness of 10 nm or less.

3. The CMOS structure of claim 1, wherein the terminal of the NFET includes III-V semiconductor material.

4. The CMOS structure of claim 1, wherein the III-V semiconductor material is InGaAs with low In content.

5. The CMOS structure of claim 1, wherein the valence band offset is about 0.5 eV or less.

6. The CMOS structure of claim 1, wherein the PFET channel includes SiGe or Ge.

7. The CMOS structure of claim 1, wherein the height difference between the terminal of the NFET and the terminal of the PFET is a thickness of the channel of the PFET.

8. The CMOS structure of claim 1, wherein the NFET and/or PFET include a raised source/drain structure.

9. The CMOS structure of claim 1, wherein the wafer is a III-V on insulator wafer.

10. The CMOS structure of claim 1, wherein the terminals of the PFET include Ge.

11. A method of fabricating a CMOS structure on a wafer, the method comprising:
    forming, on the wafer, a NFET having a gate stack and a channel;
    forming a PFET having a gate stack and a channel;
    wherein the channel of the PFET and the channel of the NFET include a semiconductor material formed on a III-V semiconductor material, such that the III-V semiconductor material acts like a buried oxide layer because of a valence band offset between the semiconductor material and the III-V semiconductor material;
    wherein there is a height difference between a terminal of the NFET and a terminal of the PFET; and
    the NFET gate stack is the same height as the PFET gate stack.

12. The method of claim 11, wherein the NFET channel and/or the PFET channel has a thickness of 10 nm or less.

13. The method of claim 11, wherein the terminal of the NFET includes III-V semiconductor material.

14. The method of claim 11, wherein the III-V semiconductor material is InGaAs with low In content.

15. The method of claim 11, wherein the valence band offset is about 0.5 eV or less.

16. The method of claim 11, wherein the PFET channel includes SiGe or Ge.

17. The method of claim 11, wherein the height difference between the terminal of the NFET and the terminal of the PFET is a thickness of the channel of the PFET.

18. The method of claim 11, wherein the NFET and/or PFET include a raised source/drain structure.

19. The method of claim 11, wherein the wafer is a III-V on insulator wafer.

20. The method of claim 11, wherein the terminals of the PFET include Ge.

\* \* \* \* \*